United States Patent
Mei et al.

(10) Patent No.: US 6,225,870 B1
(45) Date of Patent: May 1, 2001

(54) MINIATURIZED MICROWAVE CAVITY FOR ATOMIC FREQUENCY STANDARD

(75) Inventors: Ganghua Mei; Da Zhong; Shaofeng An; Jinting Liu; Xueren Huang, all of Wuhan (CN)

(73) Assignee: Wuhan Institute of Physics and Mathematics, the Chinese Academy of Sciences (CN)

( * ) Notice: Subject to any disclaimer, the term of this patent is extended or adjusted under 35 U.S.C. 154(b) by 0 days.

(21) Appl. No.: 09/425,928

(22) Filed: Oct. 25, 1999

(30) Foreign Application Priority Data

Oct. 27, 1998 (CN) .............................. 98 1 21645

(51) Int. Cl.$^7$ ................ H01S 1/06; H03B 17/00
(52) U.S. Cl. ............................................. 331/94.1
(58) Field of Search ........................... 331/3, 94.1

(56) References Cited

U.S. PATENT DOCUMENTS 4,123,727 * 10/1978 Peters ..................................... 331/94
5,387,881 * 2/1995 Schweda et al. ................... 331/94.1

\* cited by examiner

*Primary Examiner*—David Mis
(74) *Attorney, Agent, or Firm*—Pennie & Edmonds LLP

(57) ABSTRACT

The present invention relates to a kind of microwave cavity for atomic frequency standard, which consists of slotted tube, cylindrical cavity body, dielectric ring, heating filament, screw bolt for adjustment of cavity frequency. Its characteristics are listed as follows: 1. There are slots and electrodes at the upside of slotted tube. 2. The slotted tube and the bottom cap of the cavity are made as a whole. 3. The Rb absorption cell is inserted in the slotted tube. 4. The dielectric ring is inserted between the slotted tube and the cylindrical cavity body. 5. There is one or more screw hole in the wall of cylindrical cavity body. 6. One or more screw bolt for adjustment of cavity frequency is installed into the screw hole.

3 Claims, 1 Drawing Sheet

MINIATURIZED MICROWAVE CAVITY FOR ATOMIC FREQUENCY STANDARD

BACKGROUND OF THE INVENTION

The present invention relates to atomic frequency standard and microwave technique, and more particularly to a certain kind of miniaturized microwave cavity for atomic frequency standard.

At present, there exist two kinds of similar microwave cavity. The first kind is loop-gap cavity that has been described by W. Froncisz and James S. Hyde (J. Mag. Reson. Vol. 47, 515. (1982)). This kind of cavity is also called slotted tube cavity (T. Sphicopoulos and F. Gardiol, IEE Proc., Vol.134, Pt. H, No.5, 405 (October 1987)). The second is described by H. Schweda, G. Busca and P. Rochat ( U.S. Pat. No. 5,387,881), and is called magnetron cavity (G. Mileti, I. Ruedi and H. Schweda, Proc. 7th EFTF, 515(1992)).

The above two kinds of cavity are characterized by placing a coaxial slotted tube in a cylindrical cavity body. The slotted tube is formed with a tubular structure by putting several (normally four) equally spaced tile-like electrodes together. The gaps between the electrodes are called slots. The electrode has the function of inductor, and the slot acts as a capacitor. So the slotted tube is in fact an inductive-capacitive structure. The resonant frequency of the microwave cavity is mainly determined by this inductive-capacitive structure, namely is determined by the structural parameters of the slotted tube. This type of cavity has the following advantages: 1. The cavity can be very small for a determined resonant frequency, since the slotted tube can be very small. 2. The slotted tube enhances the energy of microwave field and enables to obtain proper field mode, for example, $TE_{011}$ mode. 3. The line width of microwave absorption is narrow therefore the Q factor of cavity is high. The difference between the two kinds of cavity mainly lies in the structure of slotted tubes. Electrodes are separated for the first kind of cavity, so it is necessary to cement them on a certain form of substrate material to constitute the entire slotted tube. This operation is very inconvenient, and usually results in deviations of structural parameters of the slotted tube from designed values. For the second kind of cavity, the electrodes and the cylindrical cavity body are firmly connected by metal, the slotted tube is a rigid structure. As the result, the parameters of the slotted tube, which depend on mechanical processing precision, can be controlled very precisely. Consequently, it has excellent performances. However, this kind of cavity has the shortcomings of complex structure and therefore high manufacturing cost. Furthermore, both designs of the two kinds of cavity haven't taken into account enhancing the microwave-filling factor by increasing the number of slots, further decreasing the cavity volume by loading dielectric material into the cavity, and finely adjusting the cavity frequency mechanically.

BRIEF SUMMARY OF THE INVENTION

The goal of the present invention is to provide atomic frequency standard with a kind of microwave cavity with simple structure therefore easiness in processing, small volume, convenience to finely adjust the resonant frequency, high microwave-filling factor, and high efficiency to heat atomic sample.

In order to realize the above goals, the present invention adores the following technical scheme. The cavity consists of slotted tube, cylindrical cavity body, dielectric ring, Rb absorption cell, screw bolt for adjustment of cavity frequency, and heating filament. Its characteristics are listed as follows: 1. There are slots and electrodes at the upside of the slotted tube. 2. The slotted tube and the bottom cap of the cavity are made as a whole. 3. There are more than 2 electrodes or slots (for example 2–16) on the slotted tube. 4. Rb absorption cell is inserted into the slotted tube. 5. Dielectric ring is inserted between the slotted tube and the cylindrical cavity body and cemented with them by adhesive to make the cavity form a rigid structure. 6. A screw bolt for adjustment of cavity frequency is installed in a screw hole in the wall of the cylindrical cavity body.

DETAILED DESCRIPTION OF THE INVENTION

Now the present invention will be described in detail with reference to the attached figures.

Figure 2:
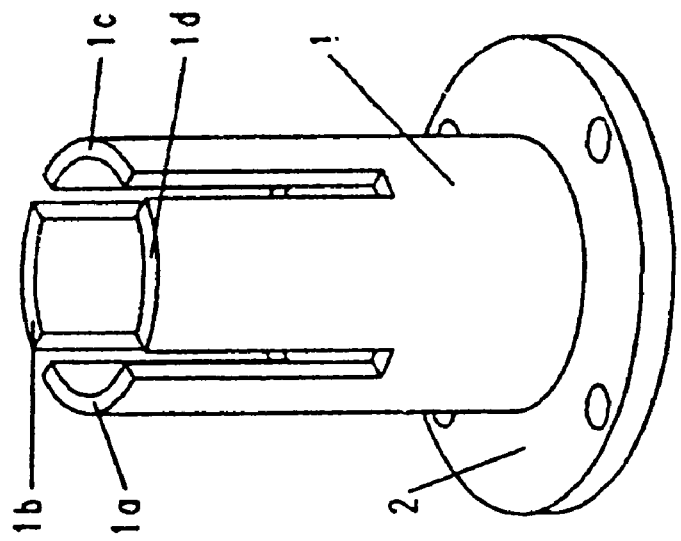
FIG. 2 shows structure of the slotted tube of the microwave cavity.
Figure 1:
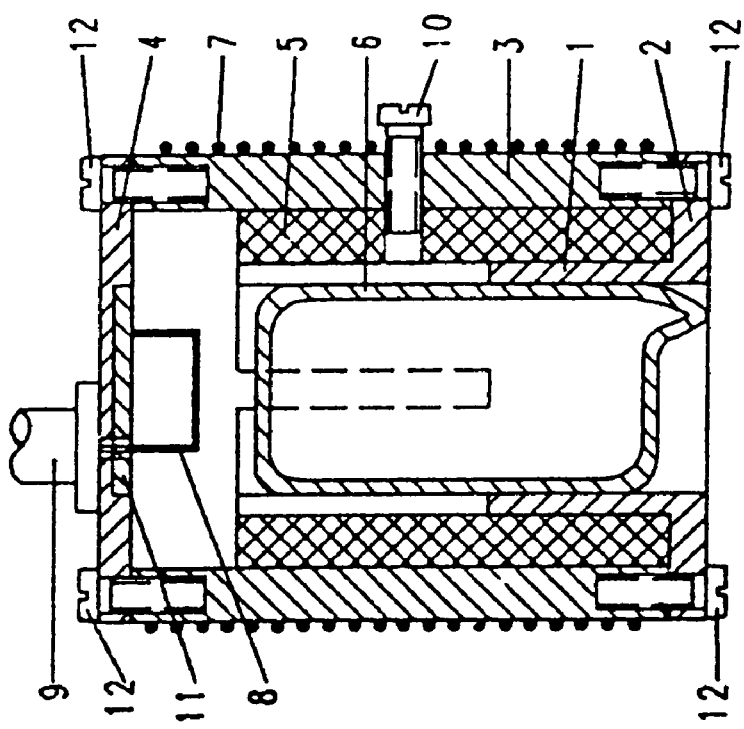
FIG. 1 shows structure of the microwave cavity for a rubidium atomic frequency standard.

According to FIG. 1 and FIG. 2, the microwave cavity consists of slotted tube 1, bottom cap 2, cylindrical cavity body 3, top cap 4, dielectric ring 5, Rb absorption cell 6, heating filament 7, coupling loop 8, socket 9, screw bolt 10, photocell 11, bolts 12. The bottom cap 2 is connected with cylindrical cavity body 3 by bolts 12, so is the top cap 4. There are 4 slots on the upside of slotted tube 1, the rest of which forms 4 electrodes 1a, 1b, 1c, and 1d. The slotted tube 1 and bottom cap 2 are made as a whole. The number of the electrodes or slots on the upside of the slotted tube 1 can be 2–16 or even more. The electrodes are equally spaced, so are the slots. High microwave-filling factor is always expected for a microwave cavity for high performance purpose. The useful part of microwave field only exists in the slots of slotted tube. The more the slots are, the higher the microwave-filling factor is. So the microwave-filling factor can be enhanced by increasing the number of slots. For ensuring a good mechanical stability of the whole cavity, Rb absorption cell 6 is tightly inserted into the slotted tube 1, and dielectric ring 5 is inserted between the slotted tube 1 and the cylindrical cavity body 3, then proper adhesive is used to firmly cement them together. The Rb absorption cell 6 contains appropriate amount of Rb metal and buffering gases with proper ratio. On the outer surface of cylindrical cavity body 3 there is heating filament 7 through which DC current is input for heating. The heat is transferred to the Rb absorption cell 6 through slotted tube 1 which is directly connected with cylindrical cavity body 3, so the Rb metal in the cell is heated and the working material of Rb atomic frequency standard, Rb vapor atoms, is produced. In this way, the heat produced by heating filament 7 is directly transferred to Rb absorption cell 6, thus ensuring high heating efficiency, low thermal power consumption, and uniform temperature distribution of the Rb absorption cell 6. The outside microwave signal is coupled into the microwave cavity through socket 9 and coupling loop 8 which is located above one of the slots of the slotted tube 1. A step recovery diode can be installed between the coupling loop 8 and socket 9 for purpose of multiplication of microwave frequency. In the walls of cylindrical cavity body 3 and dielectric ring 5, there is a coaxial screw hole, in which screw bolt 10 for adjustment of cavity frequency is installed. The screw hole is faced with one of slots of slotted tube 1.

In order to realize adjustment of resonant frequency, screw bolt 10 can be driven into or out of the cavity to slightly change the effective volume of the cavity. Thus, fine adjustment of resonant frequency can be easily operated while the rest of the cavity has been fixedly installed. More than one screw bolt can be installed in this way to make the adjustment of frequency more effective and to ensure symmetrical distribution of microwave field in the cavity. The photocell 11 is cemented onto the inner surface of top cap 4 by using insulative adhesive to detect the light absorption signal of Rb vapor atoms. The slotted tube 1, bottom cap 2, cylindrical cavity body 3, top cap 4, screw bolt 10 and bolts 12 can be made of nonmagnetic or low magnetic metal materials. Dielectric ring 5 can be made of materials with large dielectric constant and low microwave dissipation.

Compared with the existing techniques, the present invention has the following advantages and effects: 1. It is of simple structure, so it is easy to be processed. 2. It's of small size, strong microwave absorption, high Q factor and high microwave-filling factor. 3. Heating efficiency of atomic sample is high. 4. It's convenient to finely adjust the resonant frequency. In conclusion, it can be applied to a miniaturized Rb atomic frequency standard.

What is claimed is:

1. A microwave cavity for atomic frequency standard, comprising: a slotted tube; a cylindrical cavity body; a dielectric ring; a heating filament; and a screw bolt for adjustment of cavity frequency, wherein there are slots and electrodes at the upside of said slotted tube, said slotted tube and a bottom cap are made as a whole, a Rb absorption cell is inserted in said slotted tube, and said dielectric ring is inserted between said slotted tube and said cylindrical cavity body.

2. A microwave cavity for atomic frequency standard according to claim 1, wherein there is a screw hole in the wall of said cylindrical cavity body, in which said screw bolt for adjustment of cavity frequency is installed.

3. A microwave cavity for atomic frequency standard according to claim 1, wherein the number of the electrodes or slots at the upside of said slotted tube is 2–16 or more.

* * * * *